United States Patent
Kang et al.

(10) Patent No.: US 11,017,794 B2
(45) Date of Patent: May 25, 2021

(54) ELECTRONIC DEVICE, AND METHOD FOR REDUCING NOISE OF VOICE SIGNAL BY UTILIZING SAME

(71) Applicant: Samsung Electronics Co., Ltd., Gyeonggi-do (KR)

(72) Inventors: Kyungmoon Kang, Gyeongsangbuk-do (KR); Seonguk Park, Daegu (KR); Soonsang Park, Daegu (KR); Hyunsuk Choi, Daegu (KR)

(73) Assignee: Samsung Electronics Co., Ltd

( * ) Notice: Subject to any disclaimer, the term of this patent is extended or adjusted under 35 U.S.C. 154(b) by 184 days.

(21) Appl. No.: 16/325,349

(22) PCT Filed: Jul. 27, 2017

(86) PCT No.: PCT/KR2017/008128
§ 371 (c)(1),
(2) Date: Feb. 13, 2019

(87) PCT Pub. No.: WO2018/034446
PCT Pub. Date: Feb. 22, 2018

(65) Prior Publication Data
US 2019/0206419 A1      Jul. 4, 2019

(30) Foreign Application Priority Data
Aug. 19, 2016 (KR) .......................... 10-2016-0105709

(51) Int. Cl.
*G10L 21/00* (2013.01)
*G10L 21/0232* (2013.01)
(Continued)

(52) U.S. Cl.
CPC .......... *G10L 21/0232* (2013.01); *G10L 25/84* (2013.01); *H04M 1/6058* (2013.01);
(Continued)

(58) Field of Classification Search
None
See application file for complete search history.

(56) References Cited

U.S. PATENT DOCUMENTS 5,226,077 A * 7/1993 Lynn ................... H04M 1/6033
379/214.01
8,290,171 B1 * 10/2012 Helfrich ................. H04R 5/033
381/74
(Continued)

FOREIGN PATENT DOCUMENTS

JP    2009141679    6/2009
JP    2010011117    1/2010
(Continued)

OTHER PUBLICATIONS

W. S. Gan and S. M. Kuo, "Integrated active noise control communication headsets," Proceedings of the 2003 International Symposium on Circuits and Systems, 2003. ISCAS '03., Bangkok, 2003, pp. IV-IV, doi: 10.1109/ISCAS.2003.1205846. (Year: 2003).*

(Continued)

*Primary Examiner* — Edgar X Guerra-Erazo
(74) *Attorney, Agent, or Firm* — The Farrell Law Firm, P.C.

(57) ABSTRACT

Various examples in the present invention relate to an electronic device and a method for reducing noise by utilizing the same, the device and the method connecting a call using a headset, classifying a user voice signal received through the headset into a P voice signal and an N voice signal, applying the same voltage to the P voice signal and the N voice signal by using a noise reduction filter, and enabling the noise induced in the voltage to be removed by synthesizing the P voice signal and the N voice signal. In addition, other examples are possible.

14 Claims, 16 Drawing Sheets

(51) Int. Cl.
    *H04R 3/00*     (2006.01)
    *H04R 1/10*     (2006.01)
    *H04M 9/08*     (2006.01)
    *G10L 25/84*     (2013.01)
    *H04M 1/60*     (2006.01)
    *G10L 21/0208*     (2013.01)
    *H03F 3/20*     (2006.01)

(52) U.S. Cl.
    CPC ............... *H04M 9/08* (2013.01); *H04R 1/10* (2013.01); *H04R 3/00* (2013.01); *G10L 21/0208* (2013.01); *H03F 3/20* (2013.01); *H03F 2200/03* (2013.01); *H04M 1/6008* (2013.01)

(56) References Cited

U.S. PATENT DOCUMENTS

| | | | |
|---|---|---|---|
| 2005/0013447 A1* | 1/2005 | Crump | H02M 3/156 381/71.6 |
| 2005/0213773 A1 | 9/2005 | Donaldson et al. | |
| 2009/0073950 A1* | 3/2009 | Guccione | H04M 1/05 370/341 |
| 2009/0147982 A1 | 6/2009 | Ashida et al. | |
| 2009/0323976 A1 | 12/2009 | Asada et al. | |
| 2014/0079236 A1* | 3/2014 | Yamkovoy | H04R 1/1025 381/71.6 |
| 2015/0038133 A1* | 2/2015 | Einzig | H04M 1/72577 455/419 |
| 2015/0264479 A1 | 9/2015 | Sim | |
| 2015/0296286 A1* | 10/2015 | Prentice | H04R 1/1083 381/71.6 |
| 2016/0100243 A1 | 4/2016 | Wismar et al. | |
| 2017/0048605 A1* | 2/2017 | Kou | H04R 1/1041 |
| 2017/0085978 A1* | 3/2017 | Su | H04R 1/1041 |

FOREIGN PATENT DOCUMENTS

| | | |
|---|---|---|
| KR | 100615518 | 8/2006 |
| KR | 1020150107518 | 9/2015 |

OTHER PUBLICATIONS

PCT/ISA/210 Search Report issued on PCT/KR2017/008128 (pp. 5).

PCT/ISA/237 Written Opinion issued on PCT/KR2017/008128 (pp. 6).

* cited by examiner

ELECTRONIC DEVICE, AND METHOD FOR REDUCING NOISE OF VOICE SIGNAL BY UTILIZING SAME

PRIORITY

This application is a National Phase Entry of PCT International Application No. PCT/KR2017/008128 which was filed on Jul. 27, 2017, and claims priority to Korean Patent Application No. 10-2016-0105709, which was filed on Aug. 19, 2016, the content of each of which is incorporated herein by reference.

TECHNICAL FIELD

Various embodiments of the present disclosure relate to a method for noise cancellation for an audio signal by using an electronic device, and to the electronic device.

BACKGROUND ART

In the case of making a phone call using a portable electronic device, a headset (e.g., an external device that includes a microphone and performs an audio input/output function) may be connected to the portable electronic device to make a phone call. In the case of making a phone call by connecting a headset to a portable electronic device, a user can make a phone call even without holding the portable electronic device in his/her own hand, and therefore the user can make a phone call more conveniently. The described headset may be a peripheral device including a microphone, as an element thereof, for performing a microphone function of receiving a voice signal of a user, and an earphone, as another element thereof, for outputting a voice signal of a counterpart.

DISCLOSURE OF INVENTION

Technical Problem

In the case of connecting a headset to a portable electronic device and making a phone call, noise may be generated depending on the communication state and the operation environment. In order to prevent noise generation due to connection of a headset, a portable electronic device may generally be equipped with a noise reduction filter (e.g., a Π (pi) filter).

A pi filter, which is mainly used as a noise reduction filter, can reduce only noise in a specific frequency band, and therefore it may be difficult to effectively remove noise. In order to reduce noise in a plurality of frequency bands using a generally used pi filter, a plurality of elements needs to be added. Accordingly, the unit price of an electronic device may be increased. For a general portable electronic device, a bias voltage may be applied to a positive (P, +) voice signal corresponding to a microphone signal and a ground (GND) may be connected to a negative (N, −) voice signal. If noise is generated at the bias voltage or noise is generated via the ground, there may be a limitation in noise cancellation using a general noise reduction filter.

An electronic device according to various embodiments of the present disclosure may effectively reduce noise directly generated in a voice signal line by applying the same bias voltage to the P voice signal and the N voice signal.

Solution to Problem

An electronic device according to various embodiments of the present disclosure may include: a wireless communication unit; a noise reduction filter including a circuit configured to, with respect to a voice signal including a P (positive) voice signal and an N (negative) voice signal, apply the same voltage to each of the P voice signal and the N voice signal; a power supply unit; and a processor electrically connected to the wireless communication unit, the noise reduction filter, and the power supply unit, wherein the processor divides a voice signal of a user into the P voice signal and the N voice signal in the case of making a phone call using a headset, applies the same voltage to the P voice signal and the N voice signal on the basis of the noise reduction filter, and combines the P voice signal and the N voice signal so as to cancel noise induced in the voltage.

A method according to various embodiments of the present disclosure may include: connecting a call using a headset; dividing a voice signal of a user, which is received through the headset, into a P voice signal and an N voice signal; applying the same voltage to the P voice signal and to the N voice signal by means of a noise reduction filter; and combining the P voice signal and the N voice signal so as to cancel noise induced in the voltage.

Advantageous Effects of Invention

In various embodiments of the present disclosure, noise for a voice signal received through a headset may be reduced by changing the circuit structure of a noise reduction filter. In various embodiments of the present disclosure, for a voice signal including a P voice signal and an N voice signal, a circuit structure can be changed so that the same bias voltage is applied to the P voice signal and the N voice signal, and noise generated in a plurality of frequency bands and noise directly generated in a voice signal line can be reduced. In various embodiments of the present disclosure, it is not necessary to add a device to reduce noise generated in a plurality of frequency bands, so that the cost of materials for an electronic device can be reduced. According to various embodiments of the present disclosure, the cost of materials for the electronic device can be reduced while ensuring the sound quality of a voice signal.

MODE FOR THE INVENTION

Figure 1:
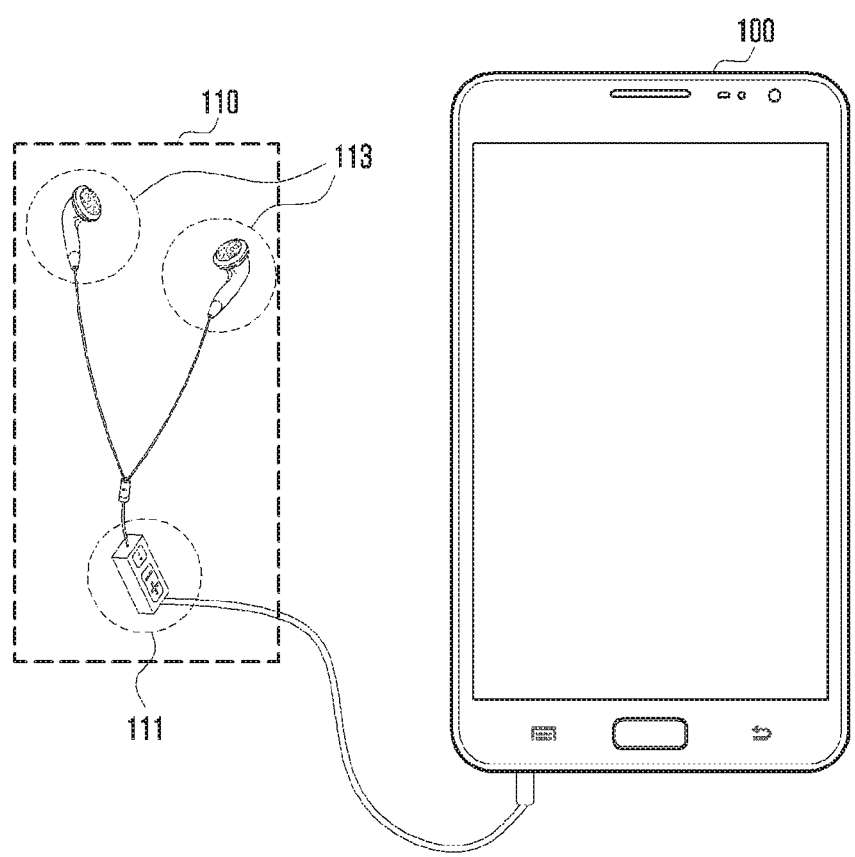
FIG. 1 is an exemplary diagram illustrating an electronic device connected to a headset according to various embodiments of the present disclosure.

Hereinafter, the present disclosure is described with reference to the accompanying drawings. Although specific embodiments are illustrated in the drawings and related detailed descriptions are discussed in the present specification, the present disclosure may have various modifications and several embodiments. However, various embodiments of the present disclosure are not limited to a specific implementation form and it should be understood that the present disclosure includes all changes and/or equivalents and substitutes included in the spirit and scope of various embodiments of the present disclosure. In connection with descriptions of the drawings, similar components are designated by the same reference numeral.

In various embodiments of the present disclosure, the terms such as "include", "have", "may include" or "may have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

In various embodiments of the present disclosure, the expression "or" or "at least one of A or/and B" includes any or all of combinations of words listed together. For example, the expression "A or B" or "at least A or/and B" may include A, may include B, or may include both A and B.

The expression "1", "2", "first", or "second" used in various embodiments of the present disclosure may modify various components of the various embodiments but does not limit the corresponding components. For example, the above expressions do not limit the sequence and/or importance of the components. The expressions may be used for distinguishing one component from other components. For example, a first user device and a second user device indicate different user devices although both of them are user devices. For example, without departing from the scope of the present disclosure, a first structural element may be referred to as a second structural element. Similarly, the second structural element also may be referred to as the first structural element.

When it is stated that a component is "(operatively or communicatively) coupled to" or "connected to" another component, the component may be directly coupled or connected to another component or a new component may exist between the component and another component. In contrast, when it is stated that a component is "directly coupled to" or "directly connected to" another component, a new component does not exist between the component and another component.

In the present disclosure, the expression "configured (or set) to do" may be used to be interchangeable with, for example, "suitable for doing," "having the capacity to do," "designed to do," "adapted to do," "made to do," or "capable of doing." The expression "configured (or set) to do" may not be used to refer to only something in hardware for which it is "specifically designed to do." Instead, the expression "a device configured to do" may indicate that the device is "capable of doing" something with other devices or parts. For example, the expression "a processor configured (or set) to do A, B and C" may refer to a dedicated processor (e.g., an embedded processor) or a generic-purpose processor (e.g., CPU or application processor) that may execute one or more software programs stored in a memory device to perform corresponding functions.

It should be appreciated that various embodiments of the present disclosure and the terms used therein are not intended to limit the technological features set forth herein to particular embodiments and include various changes, equivalents, or replacements for a corresponding embodiment. Unless otherwise defined herein, all terms including technical or scientific terms used herein have the same meanings as commonly understood by those skilled in the art to which the present disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

An electronic device according to various embodiments of the present invention may be a device including an antenna. For example, the electronic device may be one or more of the following: a smart phone, a tablet Personal Computer (PC), a mobile phone, a video phone, an e-book reader, a desktop PC, a laptop PC, a netbook computer, a Personal Digital Assistant (PDA), Portable Multimedia Player (PMP), MP3 player, a mobile medical application, a camera, and a wearable device (for example, a Head-Mounted-Device (HIVID), such as electronic glasses, electronic clothes, an electronic bracelet, an electronic necklace, an electronic appcessary, an electronic tattoo, and a smart watch).

According to some embodiments, the electronic device may be a smart home appliance having an antenna. The smart home appliance may include at least one of the following: a Television (TV), a Digital Video Disk (DVD) player, an audio player, an air conditioner, a cleaner, an oven, a microwave oven, a washing machine, an air purifier, a set-top box, a TV box (for example, Samsung HomeSync™, Apple TV™, or Google TV™), game consoles, an electronic dictionary, an electronic key, a camcorder, and an electronic frame.

According to some embodiments, the electronic device may include at least one of the following: various types of medical devices (for example, Magnetic Resonance Angiography (MRA), Magnetic Resonance Imaging (MM), Computed Tomography (CT), a scanner, an ultrasonic device and the like), a navigation device, a Global Positioning System (GPS) receiver, an Event Data Recorder (EDR), a Flight Data Recorder (FDR), a vehicle infotainment device, electronic equipment for a ship (for example, a navigation device for ship, a gyro compass and the like), avionics, a security device, a head unit for a vehicle, an industrial or home robot, an Automatic Teller Machine (ATM) of financial institutions, and a Point Of Sale (POS) device of shops.

According to some embodiments, the electronic device may include at least one of the following: furniture or a part of a building/structure, an electronic board, an electronic signature receiving device, a projector, and various types of measuring devices (for example, a water meter, an electricity meter, a gas meter, a radio wave meter and the like), which are equipped with an antenna. The electronic device according to various embodiments of the present invention may also be a combination of the devices listed above. Further, the electronic device according to various embodiments of the present disclosure may be a flexible device. It is apparent to those skilled in the art that the electronic device according to various embodiments of the present invention is not limited to the above described devices.

Hereinafter, an electronic device according to various embodiments will be discussed with reference to the accompanying drawings. The term se skilled in the art that the electronic device according to various embodiments of the present meter and the e (e.g., an artificial intelligence electronic device) using an electronic device.

FIG. 1 is an exemplary diagram illustrating an electronic device connected to a headset according to various embodiments of the present disclosure.

Referring to FIG. 1, an electronic device 100 may be connected to a headset 110. The headset 110 may be an external device including a microphone 111 for inputting a voice signal and an earphone 113 for outputting a voice signal. The headset 110 may include an external device in which a microphone is added, as one element, to a general earphone. The electronic device 100 according to various embodiments of the present disclosure may enable a phone call using the headset 110, may transfer the voice of a user to a counterpart by using the microphone 111 of the headset 110, and may transfer the voice of the counterpart through the earphone 113. The headset 110 may be a peripheral device that supports a phone call with an electronic device different from the electronic device 100.

Figure 2A:
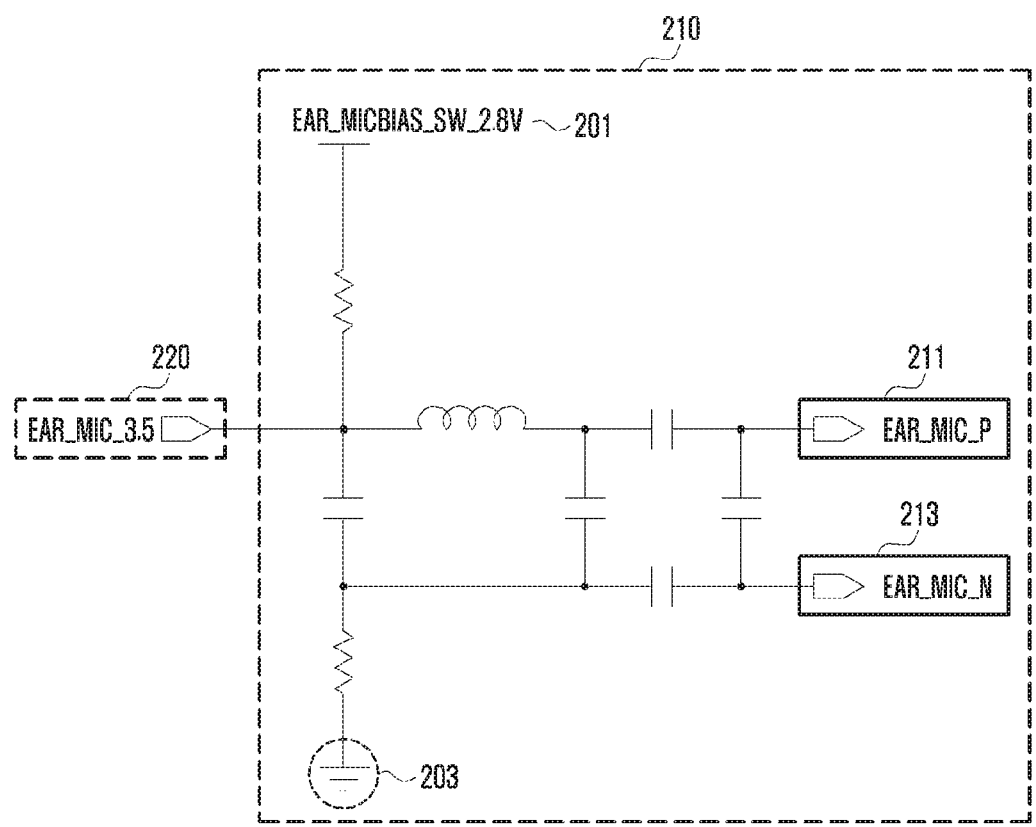
FIG. 2A and FIG. 2B are exemplary diagrams illustrating a circuit structure corresponding to a noise reduction filter.
Figure 2B:
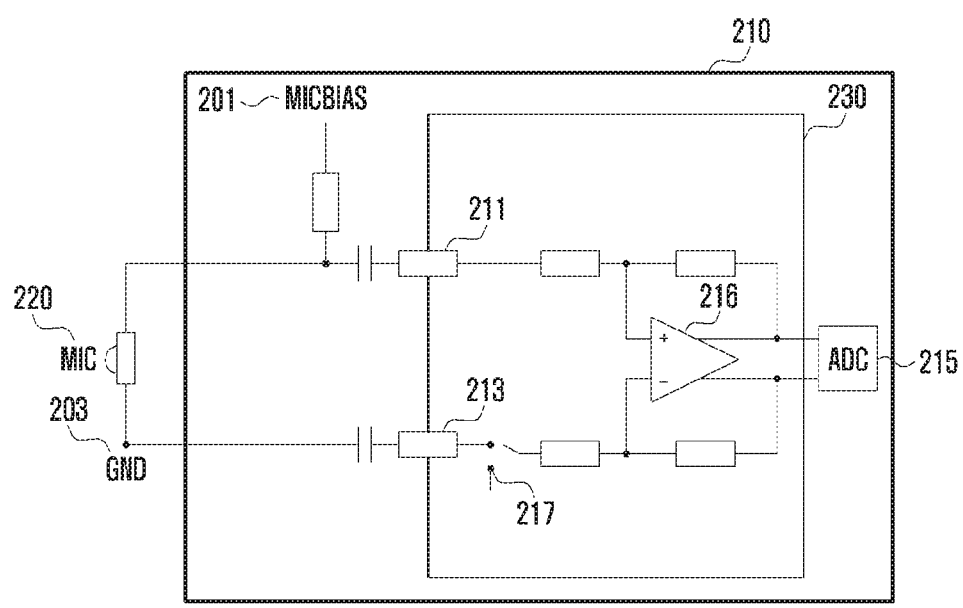

FIG. 2A and FIG. 2B are exemplary diagrams illustrating a circuit structure corresponding to a noise reduction filter.

Referring to FIG. 2A, a general electronic device may use a noise reduction filter 210 to reduce noise for a voice signal, which is generated while a headset (the headset 110 in FIG. 1) is being used. A voice signal input through a microphone 220 of the headset may be generally divided into a P voice signal 211 and an N voice signal 213, and noise may be reduced based on the noise reduction filter 210. Here, the noise reduction filter 210 may include a plurality of capacitors. The general noise reduction filter 210 may include a circuit to allow a bias voltage 201 to flow in response to the P voice signal 211, and may include a circuit to allow a ground (GND) 203 to be connected in response to the N voice signal 213.

The general noise reduction filter 210 illustrated in FIG. 2A may reduce noise only in a specific frequency band. In order to reduce, through the general noise reduction filter 210, noise generated in a plurality of frequency bands, an additional device (element) may be necessary. Accordingly, the cost of materials for the electronic device may be increased.

If noise is generated through the bias voltage 201 or noise is generated through the ground (GND), the electronic device using the general noise reduction filter may be limited in its ability to reduce the generated noise.

Referring to FIG. 2B, the general electronic device may combine, into a single voice signal, the P voice signal 211 and the N voice signal 213, which are received through the microphone 220 of the headset, and may transfer the combined voice signal to an analog-to-digital converter (ADC) 215. The electronic device may combine, into a single voice signal, the P voice signal 211, to which the bias voltage 201 is applied, and the N voice signal 213 connected to the ground 203. For example, the electronic device may combine the P voice signal 211 and the N voice signal 213, which are received through the microphone 220, into a single voice signal in a sound combination unit 230, and the combined voice signal may be transmitted to the analog-to-digital converter (ADC) 215. The sound combination unit 230 may include a power amplifier (PA) 216 or a switch 217 related to a microphone operation scheme.

Figure 3A:
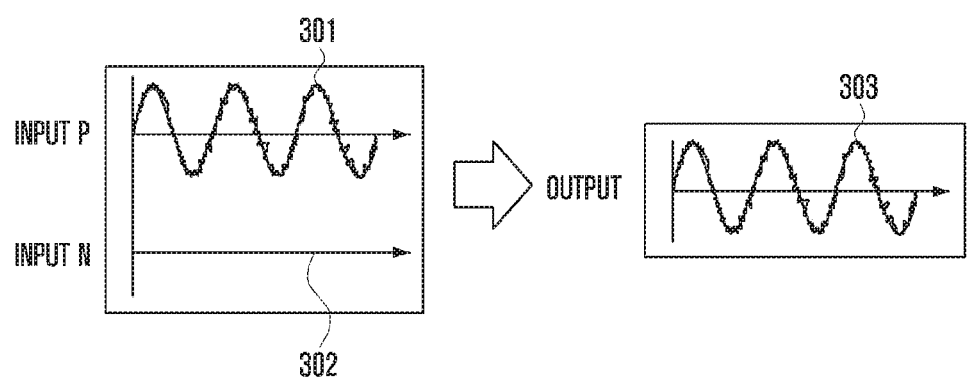
FIG. 3A to FIG. 3C are exemplary diagrams illustrating an output state of a voice signal, which is input through a microphone of a headset, if noise is induced in the voice signal.
Figure 3B:
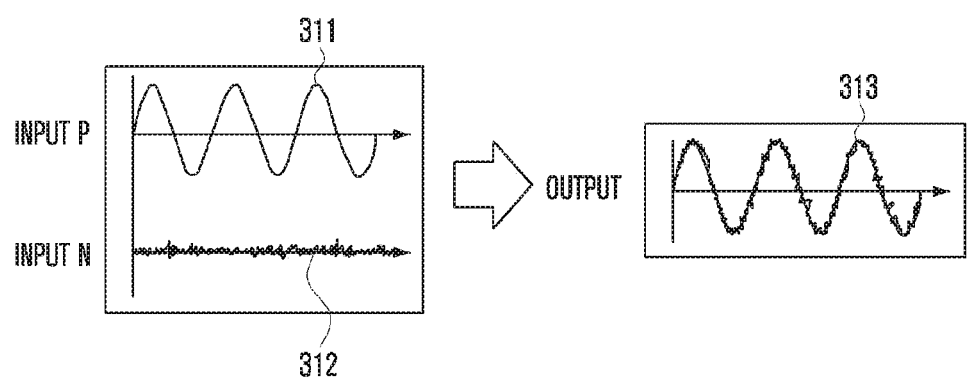
Figure 3C:
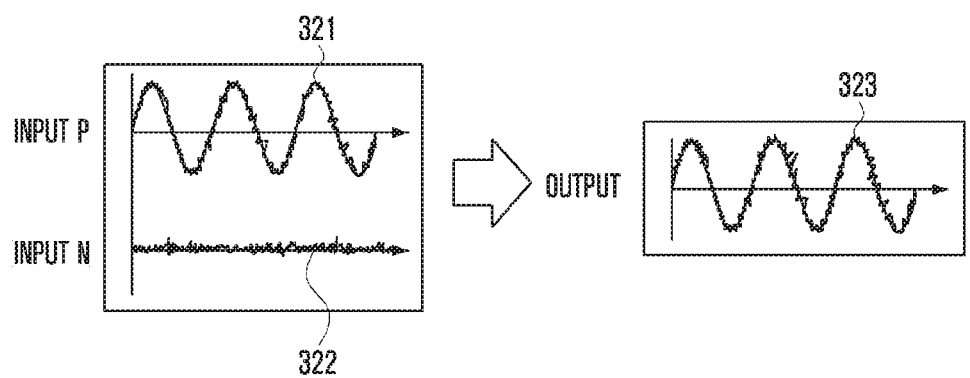

FIG. 3A to FIG. 3C are exemplary diagrams illustrating an output state of a voice signal, which is input through a microphone of a headset, when noise is induced in the voice signal.

FIG. 3A illustrates the case wherein noise is induced in a P voice signal 301 to which a bias voltage is applied. Since the bias voltage is applied to the p voice signal 301, the P voice signal may be a signal having amplitude. Since an N voice signal 302 is connected to the ground, the N voice signal may be a signal having a zero amplitude. Referring to FIG. 3A, if noise is induced in the bias voltage, the P voice signal 301 may include the noise. The electronic device may combine the input P voice signal 301 and N voice signal 302 by using an ADC, and may output the combined voice signal 303. In the case of the P voice signal 301 and the N voice signal 302, the same source (e.g., a bias voltage) is not applied, and therefore the electronic device may have difficulty cancelling noise directly induced to the bias voltage even if the P voice signal 301 and the N voice signal 302 are combined.

FIG. 3B illustrates the case wherein noise is induced in the N voice signal 320 connected to the ground. Referring to FIG. 3B, if noise is induced in the ground connected to the N voice signal 320, the N voice signal 320 may include noise. The electronic device may combine the P voice signal 311, to which the bias voltage is applied, and the N voice signal 312 including noise, using the ADC, and may output the combined voice signal 313. The electronic device may have difficulty cancelling noise directly induced in a ground line even if the P voice signal 311 and the N voice signal 312 are combined.

FIG. 3C illustrates the case where noise is induced in the P voice signal 321 to which the bias voltage is applied, and noise is also induced in the N voice signal 322 connected to the ground. The electronic device may combine the P voice signal 321 and the N voice signal 322 so as to output a single voice signal 323. As shown in FIG. 3A and FIG. 3B, described above, the electronic device using a general noise reduction filter may be limited in its ability to cancel noise induced in each line of a P voice signal line and an N voice signal line.

Figure 4:
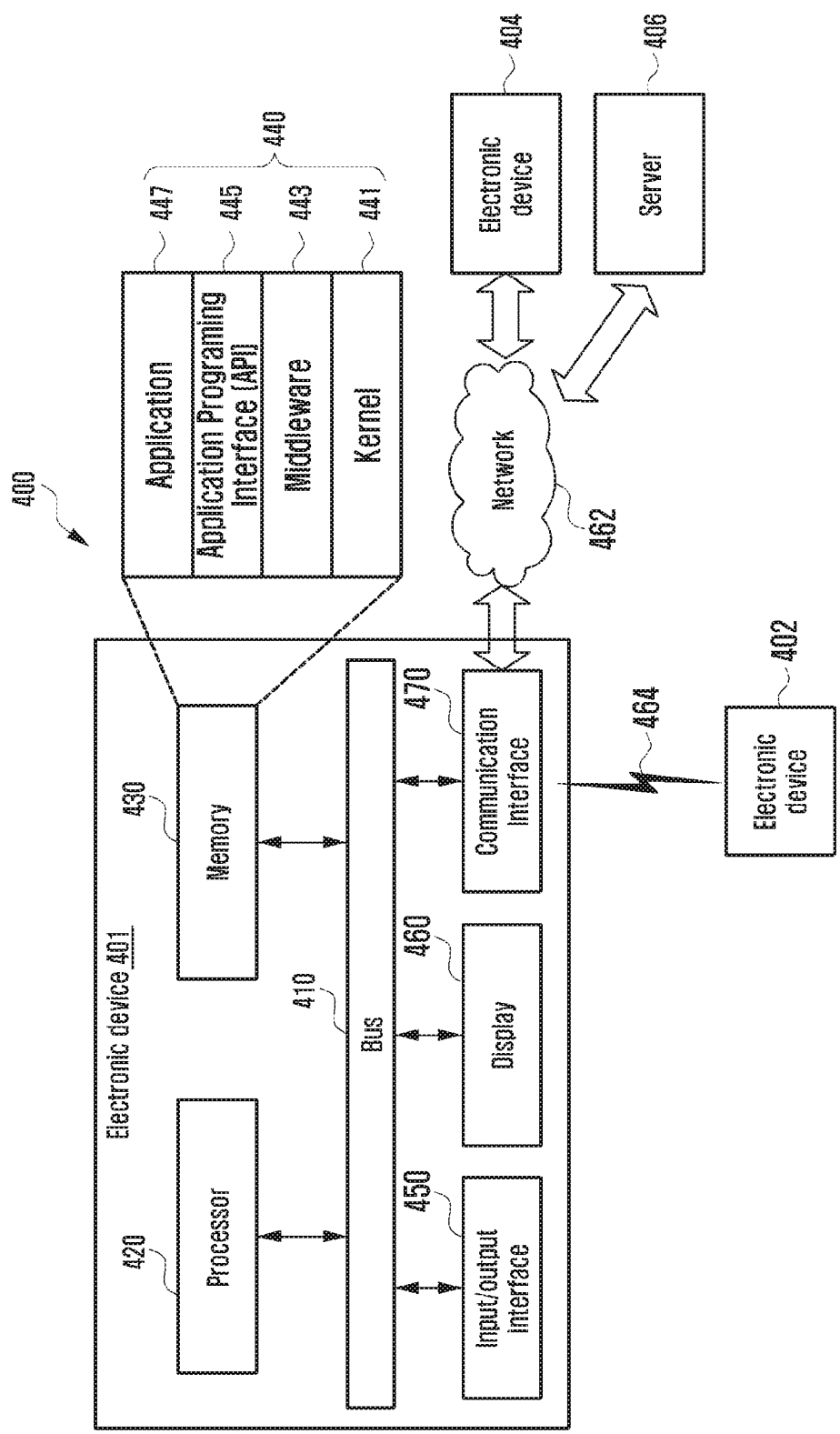
FIG. 4 is an exemplary diagram illustrating an electronic device in a network environment according to various embodiments of the present disclosure.

FIG. 4 illustrates a network environment 400 including an electronic device 401 according to various embodiments of the present disclosure.

Referring to FIG. 4, the electronic device 401, 402, 404 may connect to the server 406 via the network 462 or short-wireless communication 464.

The electronic device 401 may include a bus 410, a processor 420, a memory 430, an input/output interface 450, a display 460, and a communication interface 470. According to some embodiments, at least one of the above described components may be omitted from the electronic device 401 or another component may be further included in the electronic device 401. The bus 410 may be a circuit connecting the above described components 420, 430, and 450~470 and transmitting communications (e.g., control messages and/or data) between the above described components. The processor 420 is capable of including one or more of the following: a central processing unit (CPU), an application processor (AP), and a communication processor (CP). The processor 420 is capable of controlling at least one of other components of the electronic device 401 and/or processing data or operations related to communication.

The memory 430 is capable of including volatile memory and/or non-volatile memory. The memory 430 is capable of storing data or commands related to at least one of other components of the electronic device 401. According to an embodiment, the memory 430 is capable of storing software and/or a program module 440. For example, the program module 440 is capable of including a kernel 441, middleware 443, application programming interface (API) 445, application programs (or applications) 447, etc. The kernel 441, middleware 443 or at least part of the API 445 may be called an operating system (OS). The kernel 441 is capable of controlling or managing system resources (e.g., the bus 410, processor 420, memory 430, etc.) used to execute operations or functions of other programs (e.g., the middleware 443, API 445, and application programs 447). The kernel 441 provides an interface capable of allowing the middleware 443, API 445, and application programs 447 to access and control/manage the individual components of the electronic device 401.

The middleware 443 is capable of mediating between the API 445 or application programs 447 and the kernel 441 so that the API 445 or the application programs 447 can communicate with the kernel 441 and exchange data therewith. The middleware 443 is capable of processing one or more task requests received from the application programs 447 according to the priority. For example, the middleware 443 is capable of assigning a priority for use of system resources of the electronic device 401 (e.g., the bus 410, processor 420, memory 430, etc.) to at least one of the application programs 447. For example, the middleware 443 processes one or more task requests according to a priority assigned to at least one application program, thereby performing scheduling or load balancing for the task requests. The API 445 refers to an interface configured to allow the application programs 447 to control functions provided by the kernel 441 or the middleware 443. The API 445 is capable of including at least one interface or function (e.g., instructions) for file control, window control, image process, text control, or the like. The input/output interface 450 is capable of transferring instructions or data, received from the user or external devices, to one or more components of the electronic device 401. The input/output interface 450 is capable of outputting instructions or data, received from one or more components of the electronic device 401, to the user or external devices.

The display 460 is capable of including a Liquid Crystal Display (LCD), a flexible display, a transparent display, a Light Emitting Diode (LED) display, an Organic Light Emitting Diode (OLED) display, Micro-Electro-Mechanical Systems (MEMS) display, an electronic paper display, etc. The display 460 is capable of displaying various types of content (e.g., texts, images, videos, icons, symbols, etc.). The display 460 may also be implemented with a touch screen. In this case, the display 460 is capable of receiving touches, gestures, proximity inputs or hovering inputs, via a stylus pen, or a user's body.

The communication interface 470 is capable of establishing communication between the electronic device 401 and an external device (e.g., a first external device 402, a second electronic device 404, or a server 406). For example, the communication interface 470 is capable of communicating with an external device (e.g., a second external device 404 or a server 406) connected to the network 462 via wired or wireless communication.

Wireless communication may employ, as cellular communication protocol, at least one of the following: long-term evolution (LTE), LTE Advance (LTE-A), code division multiple access (CDMA), wideband CDMA (WCDMA), universal mobile telecommunications system (UMTS), Wireless Broadband (WiBro), and Global System for Mobile Communication (GSM). Wireless communication may also include short-wireless communication 464. Short-wireless communication 464 may include at least one of the following: wireless fidelity (WiFi), Bluetooth (BT), near field communication (NFC), Magnetic Secure Transmission (MST), and Global Navigation Satellite System (GNSS). The GNSS may include at least one of the following: Global Positioning System (GPS), Global Navigation Satellite System (Glonass), Beidou Navigation Satellite System (hereinafter called 'Beidou"), Galileo, the European global satellite-based navigation system, according to GNSS using areas, bandwidths, etc. In the present disclosure, "GPS" and "GNSS" may be used interchangeably. Wired communication may include at least one of the following: universal serial bus (USB), high definition multimedia interface (HDMI), recommended standard 232 (RS-232), and plain old telephone service (POTS). The network 462 may include at least one of the following: a telecommunications network, e.g., a computer network (e.g., LAN or WAN), the Internet, and a telephone network.

The first and second external electronic devices 402 and 404 are each identical to or different from the electronic device 401, in terms of type. According to an embodiment, the server 406 is capable of including a group of one or more servers. According to various embodiments, part or all of the operations executed on the electronic device 401 may be executed on another electronic device or a plurality of other electronic devices (e.g., electronic devices 402 and 404 or a server 406). According to an embodiment, when the electronic device needs to perform a function or service automatically or according to a request, it does not perform the function or service, but is capable of additionally requesting at least part of the function related to the function or service from other electronic device (e.g., electronic devices 402 and 404 or a server 406). The other electronic device (e.g., electronic devices 402 and 404 or a server 406) is capable of executing the requested function or additional functions, and transmitting the result to the electronic device 401. The electronic device 401 processes the received result, or further proceeds with additional processes, to provide the requested function or service. To this end, the electronic device 401 may employ cloud computing, distributed computing, or client-server computing technology.

Figure 5:
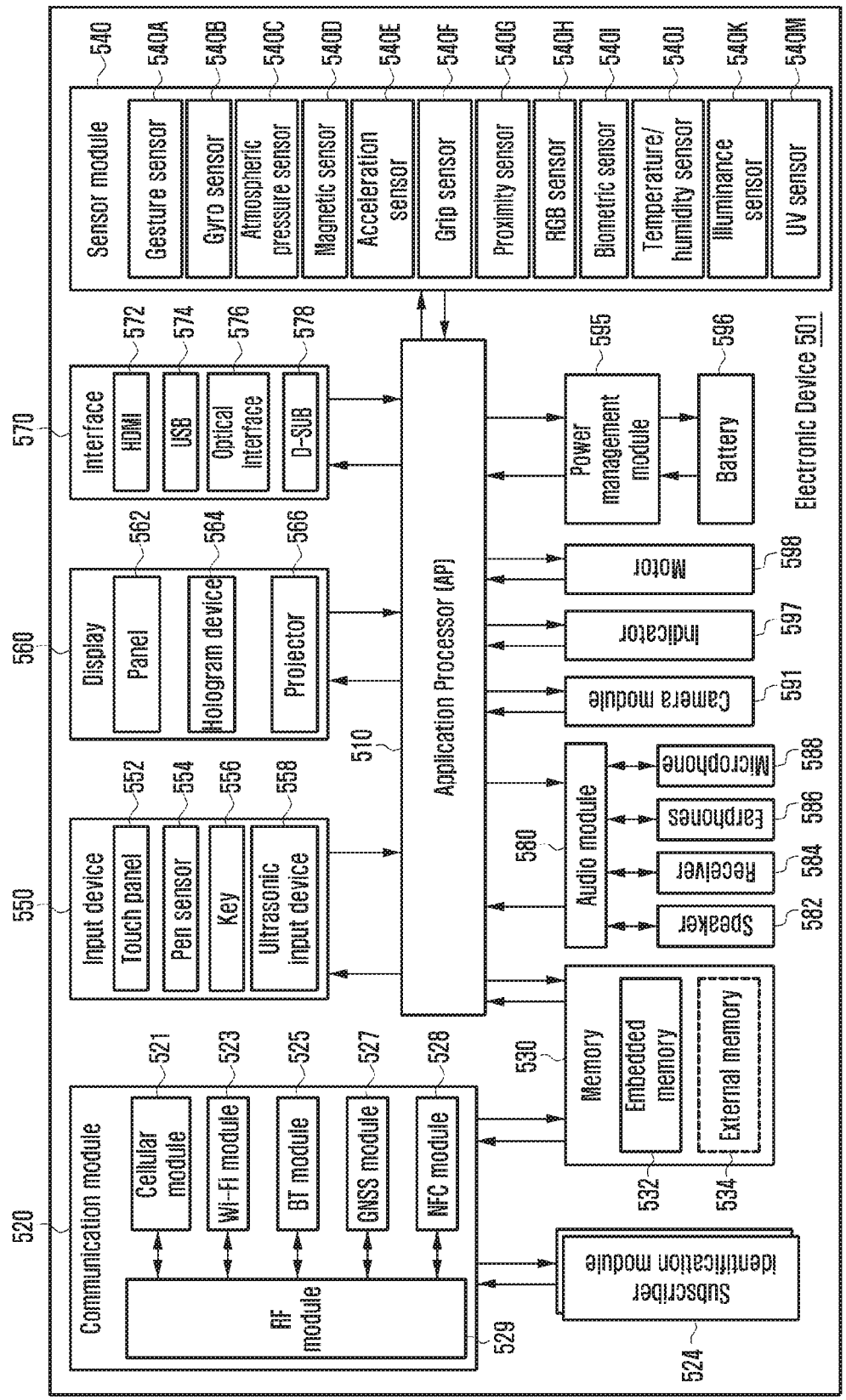
FIG. 5 is a block diagram of an electronic device according to various embodiments of the present disclosure.

FIG. 5 is a detailed block diagram showing a configuration of an electronic device 501 according to various embodiments. For example, the electronic device 501 is capable of including part or all of the components in the electronic device 401 shown in FIG. 4. The electronic device 501 is capable of including one or more processors 510 (e.g., Application Processors (APs)), a communication module 520, a Subscriber Identification Module (SIM) 524, a memory 530, a sensor module 540, an input device 550, a display 560, an interface 570, an audio module 580, a camera module 591, a power management module 595, a battery 596, an indicator 597, and a motor 598. The processor 510 is capable of driving, for example, an operating system or an application program to control a plurality of hardware or software components connected to the processor 510, processing various data, and performing operations. The processor 510 may be implemented as, for example, a System on Chip (SoC). According to an embodiment, the processor 510 may further include a graphic processing unit (GPU) and/or an image signal processor. The processor 510 may also include at least part of the components shown in FIG. 5, e.g., a cellular module 521. The processor 510 is capable of loading commands or data received from at least one of other components (e.g., a non-volatile memory) on a volatile memory, processing the loaded commands or data. The processor 510 is capable of storing various data in a non-volatile memory.

The communication module 520 may include the same or similar configurations as the communication interface 470 shown in FIG. 4. For example, the communication module 470 is capable of including a cellular module 521, WiFi module 523, Bluetooth (BT) module 525, GNSS module 527 (e.g., a GPS module, Glonass module, Beidou module or Galileo module), NFC module 528, and Radio Frequency (RF) module 529. The cellular module 521 is capable of providing a voice call, a video call, an SMS service, an Internet service, etc., through a communication network, for example. According to an embodiment, the cellular module 521 is capable of identifying and authenticating an electronic device 501 in a communication network by using a subscriber identification module (SIM) 524 (e.g., a SIM card). According to an embodiment, the cellular module 521 is capable of performing at least part of the functions provided by the processor 510. According to an embodiment, the cellular module 521 is also capable of including a communication processor (CP). Each of the WiFi module 523, the BT module 525, the GNSS module 527, and the NFC module 528 is capable of including a processor for processing data transmitted or received through the corresponding module. According to embodiments, at least part of the cellular module 521, WiFi module 523, BT module 525, GNSS module 527, and NFC module 528 (e.g., two or more modules) may be included in one integrated chip (IC) or one IC package. The RF module 529 is capable of transmission/reception of communication signals, e.g., RF signals. The RF module 529 is capable of including a transceiver, a power amp module (PAM), a frequency filter, a low noise amplifier (LNA), an antenna, etc. According to another embodiment, at least one of the following modules: cellular module 521, WiFi module 523, BT module 525, GNSS module 527, and NFC module 528 is capable of transmission/reception of RF signals through a separate RF module. The SIM module 524 is capable of including a card including a subscriber identification module (SIM) and/or an embodied SIM. The SIM module 524 is also capable of containing unique identification information, e.g., integrated circuit card identifier (ICCID), or subscriber information, e.g., international mobile subscriber identity (IMSI).

The memory 530 (e.g., memory 430 shown in FIG. 4) is capable of including a built-in memory 532 or an external memory 534. The built-in memory 532 is capable of including at least one of the following: a volatile memory, e.g., a dynamic RAM (DRAM), a static RAM (SRAM), a synchronous dynamic RAM (SDRAM), etc.; and a non-volatile memory, e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, an NOR flash memory, etc.), a hard drive, a solid state drive (SSD), etc. The external memory 534 is also capable of including a flash drive, e.g., a compact flash (CF), a secure digital (SD), a micro secure digital (Micro-SD), a mini secure digital (Mini-SD), an extreme digital (xD), a multi-media card (MMC), a memory stick, etc. The external memory 534 is capable of being connected to the electronic device 501, functionally and/or physically, through various interfaces.

The sensor module 540 is capable of measuring/detecting a physical quantity or an operation state of the electronic device 501, and converting the measured or detected information into an electronic signal. The sensor module 540 is capable of including at least one of the following: a gesture sensor 540A, a gyro sensor 540B, an atmospheric pressure sensor 540C, a magnetic sensor 540D, an acceleration sensor 540E, a grip sensor 540F, a proximity sensor 540G, a color sensor 540H (e.g., a red, green and blue (RGB) sensor), a biometric sensor 540I, a temperature/humidity sensor 540J, an illuminance sensor 540K, and a ultraviolet (UV) sensor 540M. Additionally or alternatively, the sensor module 540 is capable of further including an E-nose sensor, an electromyography (EMG) sensor, an electroencephalogram (EEG) sensor, an electrocardiogram (ECG) sensor, an infrared (IR) sensor, an iris sensor and/or a fingerprint sensor. The sensor module 540 is capable of further including a control circuit for controlling one or more sensors included therein. In embodiments, the electronic device 501 is capable of including a processor, configured as part of the processor 510 or a separate component, for controlling the sensor module 540. In this case, while the processor 510 is operating in sleep mode, the processor is capable of controlling the sensor module 540.

The input device 550 is capable of including a touch panel 552, a (digital) pen sensor 554, a key 556, or an ultrasonic input unit 558. The touch panel 552 may be implemented with at least one of the following: a capacitive touch system, a resistive touch system, an infrared touch system, and an ultrasonic touch system. The touch panel 552 may further include a control circuit. The touch panel 552 may also further include a tactile layer to provide a tactile response to the user. The (digital) pen sensor 554 may be implemented with a part of the touch panel or with a separate recognition sheet. The key 556 may include a physical button, an optical key, or a keypad. The ultrasonic input unit 558 is capable of detecting ultrasonic waves, created in an input tool, through a microphone 588, and identifying data corresponding to the detected ultrasonic waves.

The display 560 (e.g., the display 460 shown in FIG. 4) is capable of including a panel 562, a hologram unit 564, or a projector 566. The panel 562 may include the same or similar configurations as the display 460 shown in FIG. 4. The panel 562 may be implemented to be flexible, transparent, or wearable. The panel 562 may also be incorporated into one module together with the touch panel 552. The hologram unit 564 is capable of showing a stereoscopic image in the air by using light interference. The projector 566 is capable of displaying an image by projecting light onto a screen. The screen may be located inside or outside of the electronic device 501. According to an embodiment, the display 560 may further include a control circuit for controlling the panel 562, the hologram unit 564, or the projector 566. The interface 570 is capable of including a high-definition multimedia interface (HDMI) 572, a universal serial bus (USB) 574, an optical interface 576, or a D-subminiature (D-sub) 578. The interface 570 may be included in the communication interface 470 shown in FIG. 4. Additionally or alternatively, the interface 570 is capable of including a mobile high-definition link (MHL) interface, a secure digital (SD) card/multimedia card (MMC) interface, or an infrared data association (IrDA) standard interface.

The audio module 580 is capable of providing bidirectional conversion between a sound and an electronic signal. At least part of the components in the audio module 580 may be included in the input/output interface 450 shown in FIG. 4. The audio module 580 is capable of processing sound information input or output through a speaker 582, a receiver 584, earphones 586, microphone 588, etc. The camera module 591 refers to a device capable of taking both still and moving images. According to an embodiment, the camera module 591 is capable of including one or more image sensors (e.g., a front image sensor or a rear image sensor), a lens, an image signal processor (ISP), a flash (e.g., an LED or xenon lamp), etc. The power management module 595 is capable of managing power of the electronic device 501. According to an embodiment, the power management module 595 is capable of including a power management integrated circuit (PMIC), a charger IC, or a battery or fuel gauge. The PMIC may employ wired charging and/or wireless charging methods. Examples of the wireless charging method are magnetic resonance charging, magnetic induction charging, and electromagnetic charging. To this end, the PIMC may further include an additional circuit for wireless charging, such as a coil loop, a resonance circuit, a rectifier, etc. The battery gauge is capable of measuring the residual capacity, charge in voltage, current, or temperature of the battery 596. The battery 596 takes the form of either a rechargeable battery or a solar battery.

The indicator 597 is capable of displaying a specific status of the electronic device 501 or a part thereof (e.g., the processor 510), e.g., a boot-up status, a message status, a charging status, etc. The motor 598 is capable of converting an electrical signal into mechanical vibrations, such as, a vibration effect, a haptic effect, etc. Although not shown, the electronic device 501 is capable of further including a processing unit (e.g., GPU) for supporting a mobile TV. The processing unit for supporting a mobile TV is capable of processing media data pursuant to standards, e.g., digital multimedia broadcasting (DMB), digital video broadcasting (DVB), or mediaFlo™, etc.

Figure 6:
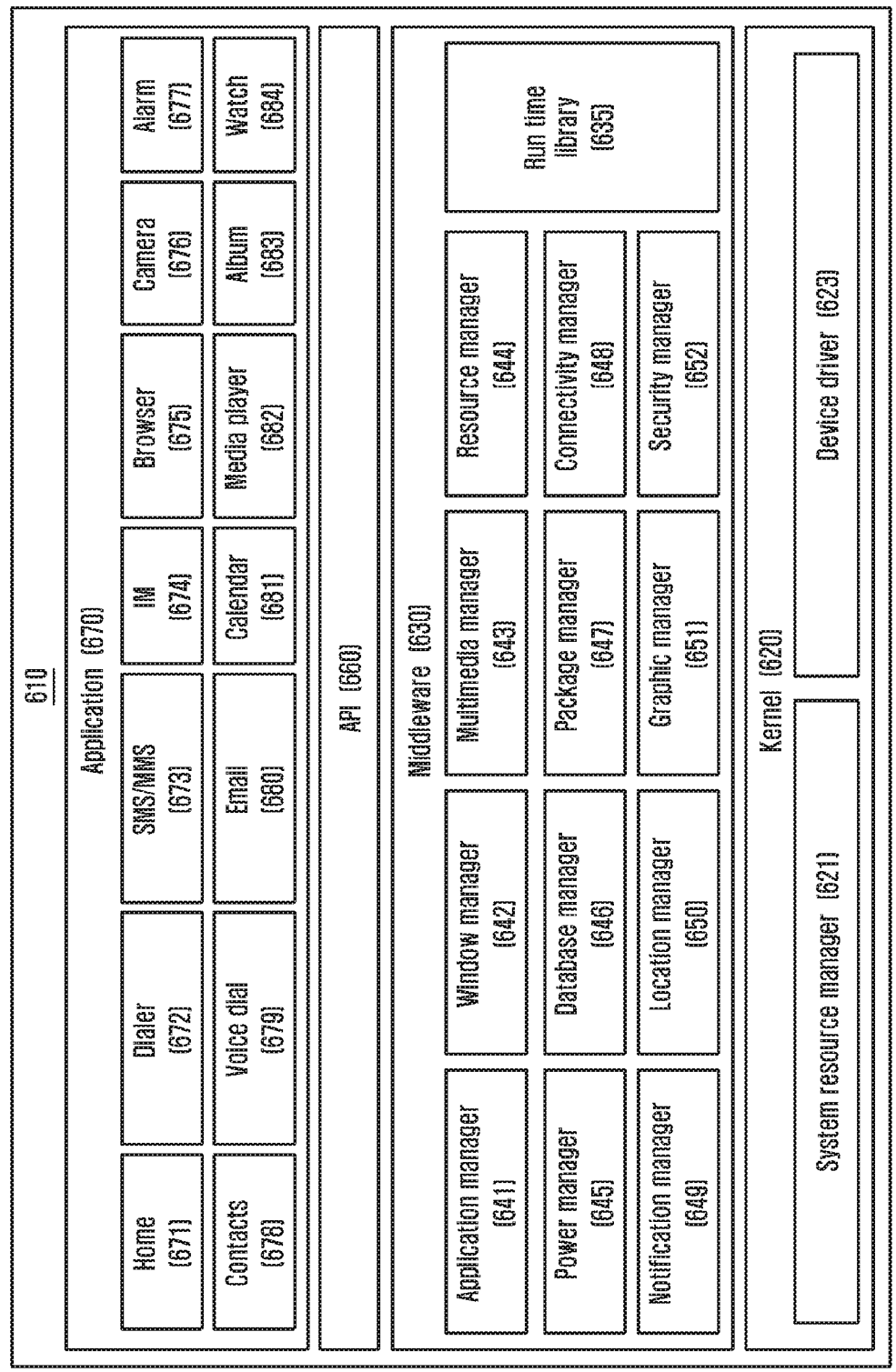
FIG. 6 is a block diagram of a program module according to various embodiments of the present disclosure.

FIG. 6 is a block diagram of a programming module according to various embodiments. According to an embodiment, the program module 610 (e.g., program module 440 shown in FIG. 4) is capable of including an operation system (OS) for controlling resources related to the electronic device (e.g., electronic device 401) and/or various applications (e.g., application programs 447 shown in FIG. 4) running on the OS. The OS may be Android, iOS, Windows, Symbian, Tizen, Bada, etc. The program module 610 is capable of including a kernel 620, middleware 630, application programming interface (API) 660 and/or applications 670. At least part of the program module 610 may be preloaded on the electronic device or downloaded from a server (e.g., an electronic device 402 or 404, server 406, etc.).

The kernel 620 (for example, kernel 441) may include a system resource manager 621 and/or a device driver 623. The system resource manager 621 may include, for example, a process manager, a memory manager, and a file system manager. The system resource manager 621 may perform a system resource control, allocation, and recall. The device driver 623 may include, for example, a display driver, a camera driver, a Bluetooth driver, a shared memory driver, a USB driver, a keypad driver, a WiFi driver, and an audio driver. Further, according to an embodiment, the device driver 623 may include an Inter-Process Communication (IPC) driver. The middleware 630 may provide a function required in common by the applications 670. Further, the middleware 630 may provide a function through the API 660 to allow the applications 670 to efficiently use limited system resources within the electronic device. According to an embodiment, the middleware 630 (for example, the middleware 443) may include at least one of a runtime library 635, an application manager 641, a window manager 642, a multimedia manager 643, a resource manager 644, a power manager 645, a database manager 646, a package manager 647, a connection manager 648, a notification manager 649, a location manager 650, a graphic manager 651, and a security manager 652.

The runtime library 635 may include, for example, a library module used by a complier to add a new function through a programming language while the applications 670 are executed. According to an embodiment, the runtime library 635 executes input and output, management of a memory, a function associated with an arithmetic function and the like. The application manager 641 may manage, for example, a life cycle of at least one of the applications 670. The window manager 642 may manage GUI resources used on the screen. The multimedia manager 643 may detect a format required for reproducing various media files and perform an encoding or a decoding of a media file by using a codec suitable for the corresponding format. The resource manager 644 manages resources such as a source code, a memory, or a storage space of at least one of the applications 670. The power manager 645 may operate together with a Basic Input/Output System (BIOS) to manage a battery or power and provides power information required for the operation. The database manager 646 may manage generation, search, and change of a database to be used by at least one of the applications 670. The package manager 647 may manage an installation or an update of an application distributed in a form of a package file.

The connection manager 648 may manage, for example, a wireless connection such as WiFi or Bluetooth. The notification manager 649 may display or notify a user of an event such as an arrival message, an appointment, a proximity alarm or the like, in a manner that does not disturb the user. The location manager 650 may manage location information of the electronic device. The graphic manager 651 may manage a graphic effect provided to the user or a user interface related to the graphic effect. The security manager 652 provides a general security function required for a system security or a user authentication. According to an embodiment, when the electronic device (for example, the electronic device 401) has a call function, the middleware 630 may further include a telephony manager for managing a voice of the electronic device or a video call function. The middleware 630 is capable of including modules configuring various combinations of functions of the above described components. The middleware 630 is capable of providing modules specialized according to types of operation systems to provide distinct functions. The middleware 630 may be adaptively configured in such a way as to remove part of the existing components or to include new components. The API 660 (for example, API 445) may be a set of API programming functions, and may be provided with a different configuration according to an operating system. For example, in Android or iOS, a single API set may be provided for each platform. In Tizen, two or more API sets may be provided.

The applications 670 (e.g., application programs 447) may include one or more applications for performing various functions, e.g., home 671, diary 672, SMS/MMS 673, instant message (IM) 674, browser 675, camera 676, alarm 677, contact 678, voice dial 679, email 680, calendar 681, media player 682, album 683, clock 684, health care (e.g., an application for measuring amount of exercise, blood sugar level, etc.), and environment information (e.g., an application for providing atmospheric pressure, humidity, temperature, etc.). According to an embodiment, the applications 670 are capable of including an application for supporting information exchange between an electronic device (e.g., electronic device 401) and an external device (e.g., electronic devices 402 and 404), which is hereafter called 'information exchange application'). The information exchange application is capable of including a notification relay application for relaying specific information to external devices or a device management application for managing external devices. For example, the notification relay application is capable of including a function for relaying notification information, created in other applications of the electronic device (e.g., SMS/MMS application, email application, health care application, environment information application, etc.) to external devices (e.g., electronic devices 402 and 404). In addition, the notification relay application is capable of receiving notification information from external devices to provide the received information to the user. The device management application is capable of managing (e.g., installing, removing or updating) at least one function of an external device (e.g., electronic devices 402 and 404) communicating with the electronic device. Examples of the function are a function of turning-on/off the external device or part of the external device, a function of controlling the brightness (or resolution) of the display, applications running on the external device, services provided by the external device, etc. Examples of the services are a call service, messaging service, etc. According to an embodiment, the applications 670 are capable of including an application (e.g., a health care application of a mobile medical device, etc.) specified attributes of an external device (e.g., electronic devices 402 and 404). According to an embodiment, the applications 670 are capable of including applications received from an external device (e.g., a server 406, electronic devices 402 and 404). According to an embodiment, the applications 670 are capable of including a preloaded application or third party applications that can be downloaded from a server. It should be understood that the components of the program module 610 may be called different names according to types of operating systems. According to various embodiments, at least part of the program module 610 can be implemented with software, firmware, hardware, or any combination of two or more of them. At least part of the program module 610 can be implemented (e.g., executed) by a processor (e.g., processor 510). At least part of the programing module 610 may include modules, programs, routines, sets of instructions or processes, etc., in order to perform one or more functions.

Figure 7:
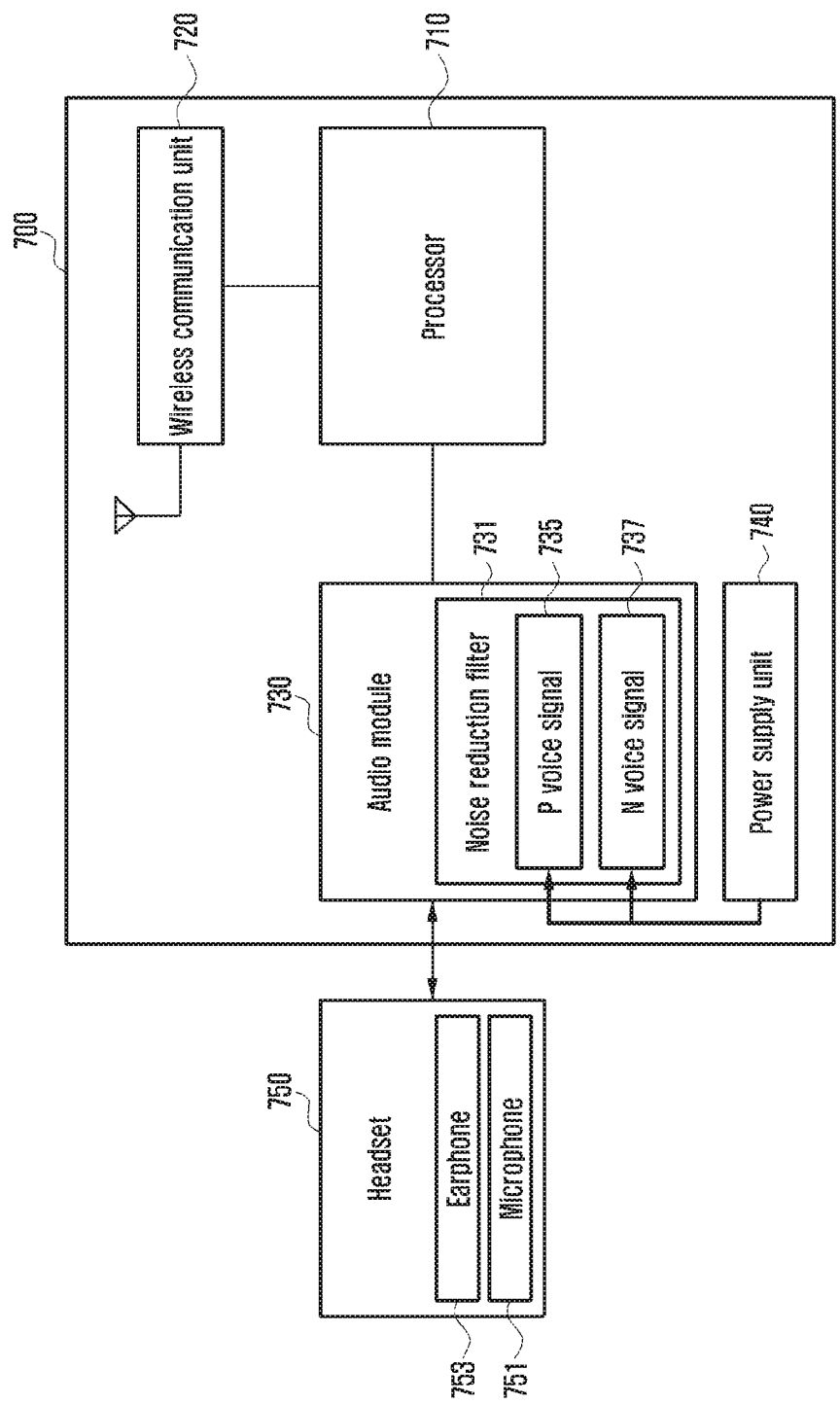
FIG. 7 is a block diagram of an electronic device connected to a headset according to various embodiments of the present disclosure.

FIG. 7 is a block diagram of an electronic device connected to a headset according to various embodiments of the present disclosure.

Referring to FIG. 7, an electronic device 700 (the electronic device 501 in FIG. 5) according to various embodiments of the present disclosure may include a processor 710, a wireless communication unit 720, an audio module 730, and a power supply unit 740. The electronic device 700 may be connected to a headset 750 (e.g., the headset 110 in FIG. 1), which is a peripheral device. The processor 710 may control multiple hardware or software elements connected to the processor 710 by running an operation system or an application, and may perform processing of and arithmetic operations on various data. The processor 710 may be implemented by, for example, a system on chip (SoC). According to an embodiment, the processor 710 may further include a graphic processing unit (GPU) and/or an image signal processor.

The processor 710 of the electronic device 700 may enable a phone conversation with another electronic device through the wireless communication unit 720. Although not illustrated, the wireless communication unit 720 may include a cellular module, and may provide voice calls and video calls with another electronic device, a text service, an Internet service, or the like by using the cellular module. According to an embodiment, the cellular module may include a communication processor (CP).

The audio module 730 may convert a voice signal and an electric signal in both directions. Although not illustrated, the audio module 730 may include a speaker, receiver, a microphone, and the like. The audio module 730 may include an input/output interface (not illustrated) for connection to a peripheral device. The audio module 730 according to various embodiments of the present disclosure may include a noise reduction filter 731. The processor 710 may reduce noise included in an audio signal (a voice signal) by using the noise reduction filter 731.

The noise reduction filter 731 may generally include a pi filter (e.g., a H (pi) filter). The noise reduction filter 731 may divide a voice signal received through the headset 750 into a P voice signal 735 and an N voice signal 737. The noise reduction filter 731 according to various embodiments of the present disclosure may connect a power supply unit 740 to each of the P voice signal 735 and the N voice signal 737 so as to apply a bias voltage. In various embodiments of the present disclosure, the same bias voltage as that applied to the P voice signal 735 may also be applied to the N voice signal 737 by changing the circuit structure of the general noise reduction filter 731. In various embodiments of the present disclosure, a noise reduction filter 731 in which the same source (e.g., the bias voltage) is applied to the P voice signal 735 and the N voice signal 737 may be implemented.

The electronic device 700 according to various embodiments of the present disclosure may be connected to the headset 750, which is a peripheral device. The headset 750 may include a microphone 751 for transferring a voice signal of a user to a counterpart and an earphone 753 for transferring a voice signal of the counterpart to the user.

The electronic device 700 according to various embodiments of the present disclosure may connect the headset 750 and the noise reduction filter 731 of the audio module 730. The electronic device 700 may reduce noise generated during a phone conversation using the noise reduction filter 731. Specifically, a large amount of noise may be generated in a procedure of transferring the voice signal of the user through the microphone 751. In various embodiments of the present disclosure, noise generated in a plurality of frequency bands may be reduced by changing a circuit structure corresponding to the noise reduction filter 731. For example, the electronic device 700 according to various embodiments of the present disclosure may divide the voice signal of the user into the P voice signal 735 and the N voice signal 737, and may apply the same bias voltage to each of the P voice signal 735 and the N voice signal 737. In various embodiments of the present disclosure, for generation of a single voice signal by combining the P voice signal 735 and the N voice signal 737, noise induced in response to the bias voltage may be cancelled. In various embodiments of the present disclosure, since the same bias voltage is applied to each of the P voice signal 735 and the N voice signal 737, if the two signals are combined, noise included in the P voice signal 735 and noise included in the N voice signal 737 may cancel each other. That is, in various embodiments of the present disclosure, noise for the P voice signal 735 and the N voice signal 737 may be cancelled. As a result, in various embodiments of the present disclosure, noise generated in a plurality of frequency bands and noise directly generated in a voice signal line (e.g., a line corresponding to a P voice signal and a line corresponding to an N voice signal) may be reduced by changing a circuit structure of a noise reduction filter.

An electronic device according to various embodiments of the present disclosure may include: a wireless communication unit; a noise reduction filter including a circuit configured to, with respect to a voice signal including a P (positive) voice signal and an N (negative) voice signal, apply the same voltage to each of the P voice signal and the N voice signal; a power supply unit; and a processor electrically connected to the wireless communication unit, the noise reduction filter, and the power supply unit, wherein the processor divides a voice signal of a user into the P voice signal and the N voice signal in the case of making a phone call using a headset, applies the same voltage to the P voice signal and the N voice signal on the basis of the noise reduction filter, and combines the P voice signal and the N voice signal so as to cancel noise induced in the voltage.

The noise reduction filter according to various embodiments may divide the voice signal of the user into the P voice signal and the N voice signal, and in order to allow the same voltage as that applied to the P voice signal to be applied to the N voice signal, the noise reduction filter may connect wiring corresponding to the voltage to wiring corresponding to the N voice signal.

The noise reduction filter according to various embodiments may change a wiring structure corresponding to the N voice signal so that the N voice signal is not connected to the ground.

According to various embodiments, the processor may cause a sound combination unit to perform combination into a single voice signal on the basis of the P voice signal and the N voice signal, to which the same voltage has been applied, and may cancel noise induced in the voltage via the combination thereof.

According to various embodiments, the processor may cancel noise generated in a plurality of frequency bands and noise directly generated in a voice signal line corresponding to the P voice signal and the N voice signal through the combination of the P voice signal and the N voice signal.

The sound combination unit according to various embodiments may include a power amplifier, which amplifies the P voice signal and the N voice signal, and a switch that determines a microphone operation scheme to be one of a single-ended scheme and a differential scheme.

According to various embodiments, the processor may transmit the combined single voice signal to an analog-to-digital converter (ADC) so as to enable conversion of the transmitted voice signal into a digital signal.

According to various embodiments, the headset may be an external device including a microphone and an earphone, may receive a voice signal of the user on the basis of the microphone when the microphone is connected to the electronic device, and may output a voice signal of a counterpart on the basis of the earphone.

Figure 8:
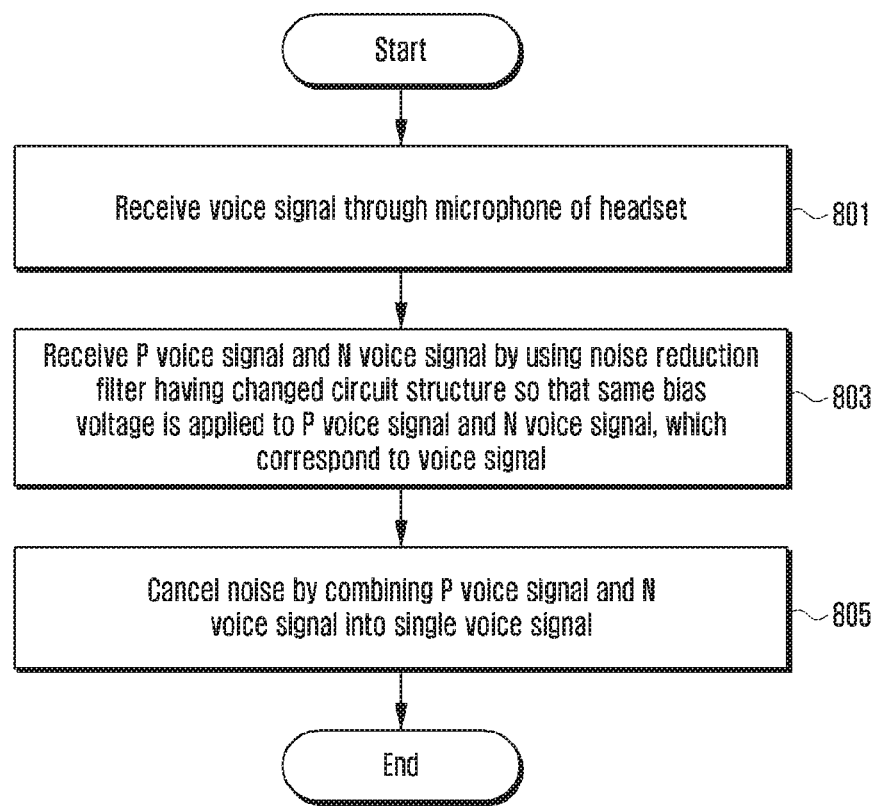
FIG. 8 is a flowchart illustrating a method for reducing noise of a voice signal by changing a circuit structure of a noise reduction filter according to various embodiments of the present disclosure.

FIG. 8 is a flowchart illustrating a method for reducing noise of a voice signal by changing a circuit structure of a noise reduction filter according to various embodiments of the present disclosure.

Referring to FIG. 8, in operation 801, the processor 710 of the electronic device (the electronic device 700 in FIG. 7) according to various embodiments of the present disclosure may receive a voice signal of a user through the headset 750.

In operation 803, the processor 710 may use a noise reduction filter, the circuit structure of which has been changed so that the same bias voltage is applied to a P voice signal and an N voice signal, which correspond to the voice signal of the user, so as to receive the P voice signal and the N voice signal. The noise reduction filter according to various embodiments of the present disclosure may be a filter, the circuit structure of which has been changed so that the same bias voltage is applied to the P voice signal and to the N voice signal. In various embodiments of the present disclosure, a circuit structure may be changed so that a bias voltage applied to the P voice signal is also applied to the N voice signal. That is, in various embodiments of the present disclosure, the circuit is changed so that the same bias voltage is applied to the P voice signal and the N voice signal, and the P voice signal and the N voice signal, which have the same bias voltage, may be received. In various embodiments of the present disclosure, the P voice signal and the N voice signal may have the same phase. Depending on the circuit structure, the P voice signal and the N voice signal may not have the same signal amplitude, but may have the same phase. In various embodiments of the present disclosure, if the P voice signal and the N voice signal are combined into a single voice signal, a voice signal having the same sound quality as that of the original voice signal may be realized.

The electronic device 700 according to various embodiments of the present disclosure may change the circuit structure of the noise reduction filter so that the same source (the bias voltage) is applied to the P voice signal and the N voice signal, which correspond to the voice signal of the user. Further, in operation 805, the processor 710 may combine the P voice signal and the N voice signal, to which the same bias voltage is applied, into a single voice signal. The processor 710 may combine the P voice signal and the N voice signal using the analog-to-digital converter (ADC). In various embodiments of the present disclosure, by combining the P voice signal and the N voice signal, to which the same bias voltage is applied, into a single voice signal, noise generated in a plurality of frequency bands and noise directly generated in a P voice signal line and an N voice signal line may be cancelled.

Figure 9A:
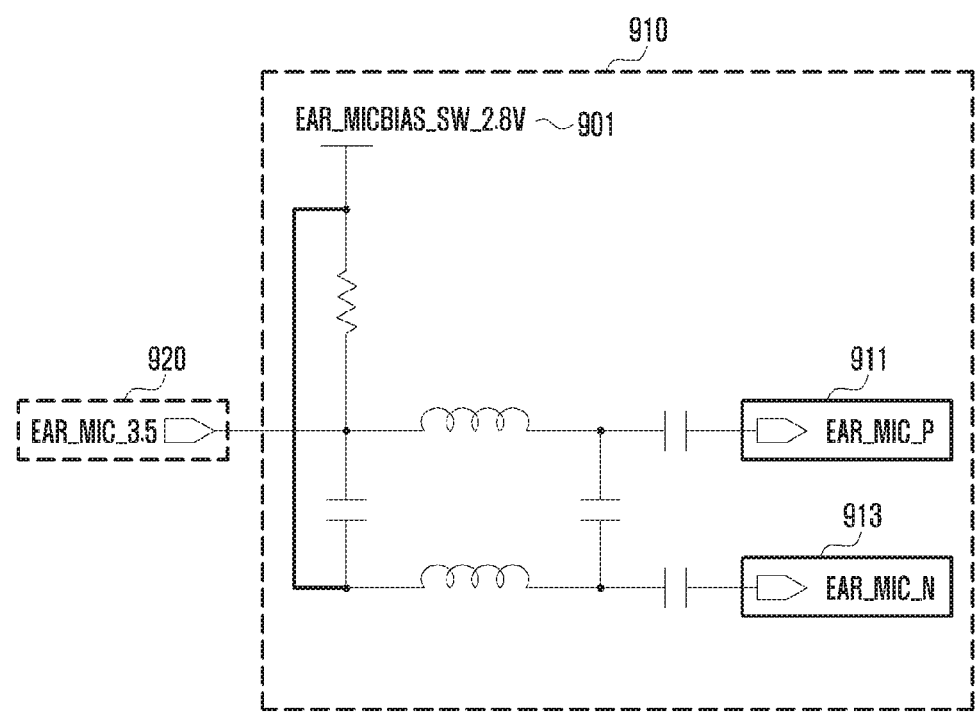
FIG. 9A and FIG. 9B are exemplary diagrams illustrating a changed circuit structure of a noise reduction filter such that the same bias voltage flows through a P voice signal and an N voice signal, which correspond to a voice signal according to various embodiments of the present disclosure.
Figure 9B:
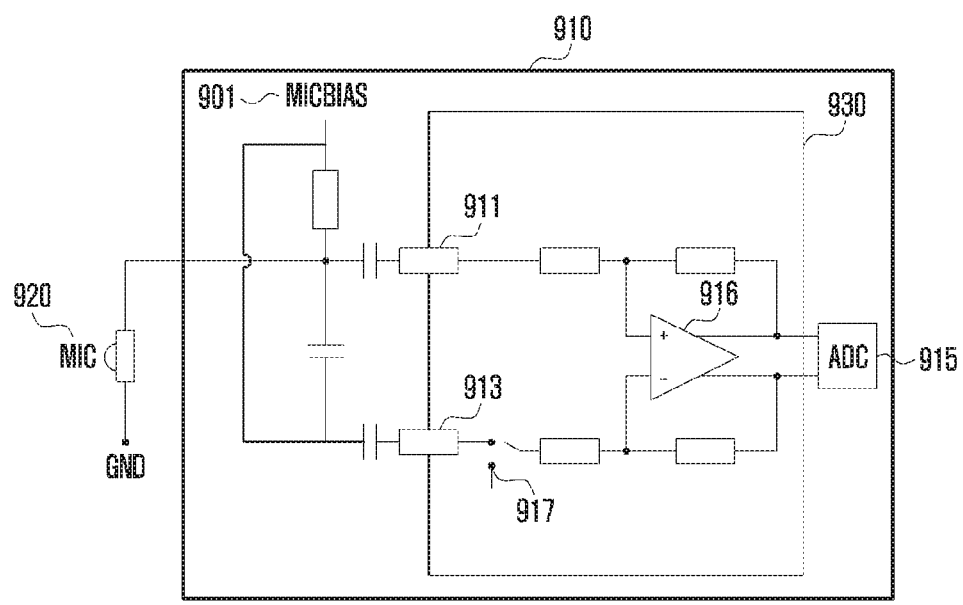

FIG. 9A and FIG. 9B are exemplary diagrams illustrating a changed circuit structure of a noise reduction filter such that the same bias voltage flows through a P voice signal and an N voice signal, which correspond to a voice signal according to various embodiments of the present disclosure.

Referring to FIG. 9A, an electronic device (the electronic device 700 in FIG. 7) according to various embodiments of the present disclosure may use a noise reduction filter 910 in order to reduce noise of a voice signal, which is generated while using a microphone 920 (the microphone 751 in FIG. 7) of a headset (the headset 750 in FIG. 7). The noise reduction filter 910 according to various embodiments of the present disclosure may divide a voice signal of a user, which is received through the microphone 920 of the headset, into a P voice signal 911 and an N voice signal 913 and may receive the same. The circuit structure of the noise reduction filter 910 according to various embodiments of the present disclosure may be changed so that the same bias voltage 901 is applied to the P voice signal 911 and to the N voice signal 913. For example, the noise reduction filter 910 according to various embodiments of the present disclosure may change the circuit structure thereof so that the same bias voltage 901 as that applied to the P voice signal 911 is also applied to the N voice signal 913. In various embodiments of the present disclosure, since the same bias voltage is applied to the P voice signal 911 and the N voice signal 913, the noise of the voice signal may be reduced. In various embodiments of the present disclosure, the circuit structure may be changed so that the N voice signal 913 is not connected to the ground and the bias voltage is applied to the N voice signal.

Referring to FIG. 9B, the electronic device according to various embodiments of the present disclosure may combine, into a single voice signal, the P voice signal 911 and the N voice signal 913, which are received through the microphone 920 of the headset, and may transfer the combined voice signal to an analog-to-digital converter (ADC) 915. For example, various embodiments of the present disclosure may include the noise reduction filter 910, which applies the same bias voltage 901 to the P voice signal 911 and to the N voice signal 913. In the electronic device according to various embodiments of the present disclosure, a sound combination unit 930 may perform combination into a single voice signal on the basis of the P voice signal 911 and the N voice signal 913, to which the same bias voltage 901 is applied, and the combined voice signal may be transmitted to the analog-to-digital converter (ADC) 915. The sound combination unit 930 may include a power amplifier (PA) 916 or a switch 917 related to a microphone operation scheme. In detail, the electronic device may transfer the P voice signal 911 and the N voice signal 913 to the power amplifier (PA) 916, and may amplify the P voice signal 911 and the N voice signal 913. Further, the electronic device may combine the amplified P voice signal 911 and N voice signal 913 into a single voice signal using the analog-to-digital converter (ADC) 915. The switch 917 provided in the path along which the N voice signal 913 moves to the ADC 915 may be a switch for controlling the operation scheme of the microphone 920. The electronic device may determine, using the switch 917, whether the operation scheme of the microphone 920 is a single-ended scheme or a differential scheme.

In the electronic device according to various embodiments of the present disclosure, the P voice signal 911 and the N voice signal 913 may be combined into a single voice signal, and noise that is directly generated from the bias voltage 901 may thus be cancelled. For example, noise may be directly generated in the bias voltage 901 due to the communication state and the operation environment of the electronic device. In various embodiments of the present disclosure, the bias voltage 901 may be applied to each of the P voice signal 911 and the N voice signal 913, and the P voice signal 911 and the N voice signal 913 may be combined. In various embodiments of the present disclosure, noise that is directly generated from the bias voltage 901 may be cancelled through a procedure of combining the P voice signal 911 and the N voice signal 913.

Figure 10:
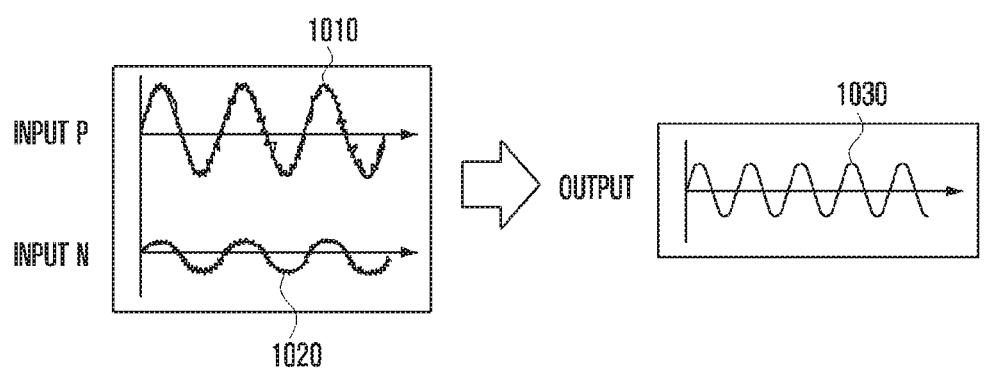
FIG. 10 is an exemplary diagram illustrating the situation in which noise has been reduced using a noise reduction filter that has been changed to allow the same bias voltage to flow through a P voice signal and an N voice signal of a voice signal.

FIG. 10 is an exemplary diagram illustrating the situation in which noise has been cancelled using a noise reduction filter that has been changed to allow the same bias voltage to flow through a P voice signal and an N voice signal of a voice signal.

Referring to FIG. 10, in various embodiments of the present disclosure, a voice signal of a user may be divided into a P voice signal 1010 and an N voice signal 1020 and then received. In various embodiments of the present disclosure, the circuit structure of a noise reduction filter may be changed so that the same bias voltage is applied to the P voice signal 1010 and to the N voice signal 1020. In various embodiments of the present disclosure, since the P voice signal 1010 and the N voice signal 1020 may be combined into a single voice signal 1030, even if noise is directly generated in the bias voltage, the noise may be cancelled in a procedure of combining the P voice signal 1010 and the N voice signal 1020. In various embodiments of the present disclosure, noise corresponding to a plurality of frequency bands may be cancelled through the procedure of combining the P voice signal 1010 and the N voice signal 1020. In various embodiments of the present disclosure, the single voice signal 1030, from which noise has been cancelled by combining the P voice signal 1010 and the N voice signal 1020, may be transmitted to a different electronic device.

Figure 11A:
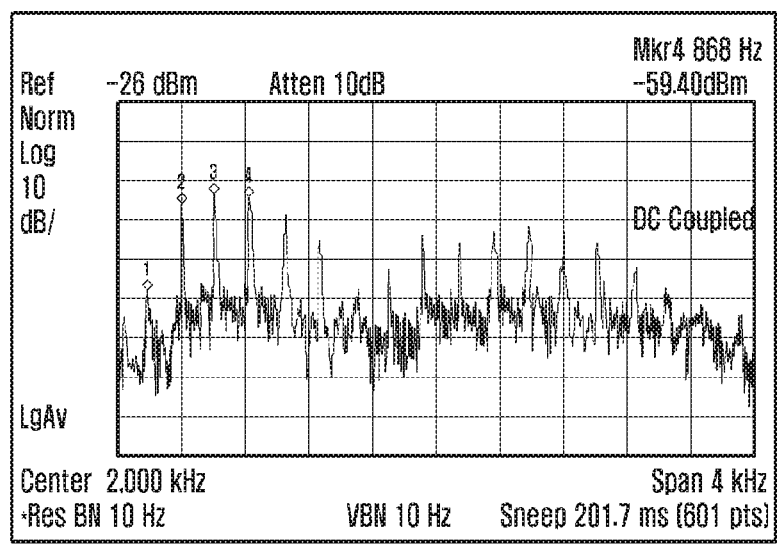
FIG. 11A and FIG. 11B are graphs for illustrating the noise cancellation effect of an electronic device according to various embodiments of the present disclosure.
Figure 11B:
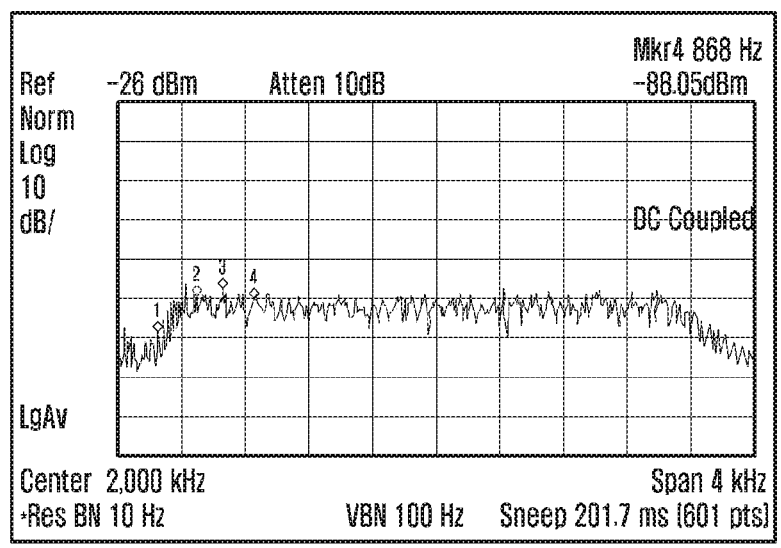

FIG. 11A and FIG. 11B are graphs for illustrating the noise cancellation effect of an electronic device according to various embodiments of the present disclosure.

Referring to FIG. 11A and FIG. 11B, FIG. 11A illustrates a graph obtained by measuring a TDMA noise level in the case in which a phone call is made using a conventional electronic device and a headset. FIG. 11B illustrates a graph obtained by measuring the TDMA noise level in the case in which an electronic device according to various embodiments of the present disclosure makes a phone call using a headset. [98] Referring to FIG. 11A, the TDMA noise of the conventional electronic device has an intensity of approximately −59.40 dBm. In general, when an audio signal has an intensity of −70 dBm or higher, a user may recognize generated noise. That is, if a user makes a phone call using a conventional electronic device and a headset, the user may recognize noise for a voice signal and may not be satisfied with the call quality.

Referring to FIG. 11B, the TDMA noise of the electronic device according to various embodiments of the present disclosure may have an intensity of approximately −88.05 dBm. If the user makes a phone call using the electronic device according to various embodiments of the present disclosure and the headset, the user may not recognize TDMA noise. Various embodiments of the present disclosure may provide an effect in which the TDMA noise is cancelled, and the user may thus be satisfied with the call quality.

Although not illustrated, in a general electronic device, if an external power source is input, noise corresponding to the external power source may be induced. The general electronic device may have difficulty in cancelling noise corresponding to the external power source. In the electronic device according to various embodiments of the present disclosure, since the same bias voltage is applied to a P voice signal and to an N voice signal, even if noise corresponding to the external power source is induced, the noise may be cancelled through a procedure of combining the P voice signal and the N voice signal.

In the electronic device according to various embodiments of the present disclosure, the same bias voltage is applied to the P voice signal and to the N voice signal, and noise induced in the bias voltage may be efficiently cancelled through the procedure of combining the P voice signal and the N voice signal. The electronic device according to various embodiments of the present disclosure may transfer the voice signal of a user to a counterpart without degrading the quality of the voice signal.

A method according to various embodiments of the present disclosure may include: connecting a call using a headset; dividing a voice signal of a user, which is received through the headset, into a P voice signal and an N voice signal; applying the same voltage to the P voice signal and to the N voice signal by means of a noise reduction filter; and combining the P voice signal and the N voice signal so as to cancel noise induced in the voltage.

A method according to various embodiments may include using a noise reduction filter in which wiring corresponding to voltage applied to the P voice signal is connected to wiring corresponding to the N voice signal so that the same as that applied to the P voice signal is applied to the N voice signal, and applying the same voltage to the P voice signal and to the N voice signal using the noise reduction filter.

The noise reduction filter according to various embodiments may change a wiring structure corresponding to the N voice signal so that the N voice signal is not connected to the ground.

The method according to various embodiments may include causing a sound combination unit to perform combination into a single voice signal on the basis of the P voice signal and the N voice signal, to which the same voltage has been applied, and cancelling noise induced in the voltage via the combination thereof.

The method according to various embodiments may include cancelling noise generated in a plurality of frequency bands and noise directly generated in a voice signal line corresponding to the P voice signal and the N voice signal through the combination of the P voice signal and the N voice signal.

The sound combination unit according to various embodiments may include a power amplifier, which amplifies the P voice signal and the N voice signal, and a switch that determines a microphone operation scheme to be one of a single-ended scheme and a differential scheme.

The method according to various embodiments of the present disclosure may further include transmitting the combined single voice signal to an analog-to-digital converter (ADC) so as to enable conversion of the transmitted voice signal into a digital signal.

According to various embodiments, the headset may be an external device including a microphone and an earphone, may receive a voice signal of the user on the basis of the microphone when the microphone is connected to the electronic device, and may output a voice signal of a counterpart on the basis of the earphone.

The term "module" as used herein may include a unit consisting of hardware, software, or firmware, and may, for example, be used interchangeably with the term "logic", "logical block", "component", "circuit", or the like. The "module" may be an integrated component or a minimum unit for performing one or more functions or a part thereof. The "module" may be implemented mechanically or electronically, and may include, for example, an Application-Specific Integrated Circuit (ASIC) chip, a Field-Programmable Gate Array (FPGA), or a programmable logic device, which is known or is to be developed in the future, for performing certain operations.

At least some of devices (e.g., modules or functions thereof) or methods (e.g., operations) according to various embodiments may be implemented as instructions which are stored a computer-readable storage medium (e.g., the memory 130) in the form of a program module. If the instructions are executed by a processor, the processor may perform a function corresponding to the instructions. The computer-readable storage medium may include a hard disk, a floppy disk, a magnetic medium (e.g., a magnetic tape), optical media (e.g., CD-ROM, DVD), magneto-optical media (e.g., a floptical disk), internal memory, etc. The instructions may include code compiled by a complier or code that can be executed by an interpreter.

The programming module according to the present disclosure may include one or more of the aforementioned components or may further include other additional components, or some of the aforementioned components may be omitted. Operations performed by a module, a programming module, or other elements according to various embodiments may be executed sequentially, in parallel, repeatedly, or in a heuristic manner. At least some operations may be executed according to another sequence, may be omitted, or may further include other operations.

The invention claimed is:

1. An electronic device comprising:
a wireless communication unit;
a noise reduction filter including a circuit configured to, with respect to a voice signal including a P (positive) voice signal and an N (negative) voice signal, apply the same voltage to each of the P voice signal and the N voice signal;
a power supply unit; and
a processor electrically connected to the wireless communication unit, the noise reduction filter, and the power supply unit,
wherein the processor is configured to:
divide a voice signal of a user into the P voice signal and the N voice signal in a case of making a phone call using a headset,
apply the same voltage to the P voice signal and the N voice signal on the basis of the noise reduction filter, and
combine the P voice signal and the N voice signal so as to cancel noise induced in the voltage, and
wherein the noise reduction filter divides the voice signal of the user into the P voice signal and the N voice signal, and connects wiring corresponding to voltage applied to the P voice signal to wiring corresponding to the N voice signal so that the same voltage as that applied to the P voice signal is applied to the N voice signal.

2. The electronic device of claim 1 wherein the noise reduction filter changes a structure of the wiring corresponding to the N voice signal so that the N voice signal is not connected to the ground.

3. The electronic device of claim 1, wherein the processor causes a sound combination unit to perform combination into a single voice signal on the basis of the P voice signal and the N voice signal, to which the same voltage has been applied, and cancels noise induced in the voltage, via the combination.

4. The electronic device of claim 3, wherein the processor cancels noise generated in a plurality of frequency bands and noise directly generated in a voice signal line corresponding to the P voice signal and the N voice signal, via the combination of the P voice signal and the N voice signal.

5. The electronic device of claim 3, wherein the sound combination unit comprises:
a power amplifier configured to amplify the P voice signal and the N voice signal; and
a switch configured to determine a microphone operation scheme to be one of a single-ended scheme and a differential scheme.

6. The electronic device of claim 3, wherein the processor transmits the combined single voice signal to an analog-to-digital converter (ADC) so as to enable conversion of the transmitted voice signal into a digital signal.

7. The electronic device of claim 1, wherein the headset is an external device including a microphone and an earphone, and the headset receives a voice signal of the user on the basis of the microphone when the microphone is connected to the electronic device, and outputs a voice signal of a counterpart on the basis of the earphone.

8. A noise reduction method comprising:
connecting a call using a headset;
dividing a voice signal of a user, which is received through the headset, into a P voice signal and an N voice signal;
applying the same voltage to the P voice signal and the N voice signal by means of a noise reduction filter; and
combining the P voice signal and the N voice signal, thereby cancelling noise induced in the voltage,
wherein the noise reduction filter divides the voice signal of the user into the P voice signal and the N voice signal, and connects wiring corresponding to voltage applied to the P voice signal to wiring corresponding to the N voice signal so that the same voltage as that applied to the P voice signal is applied to the N voice signal.

9. The method of claim 8,
wherein the noise reduction filter is a filter in which a wiring structure corresponding to the N voice signal has been changed so that the N voice signal is not connected to the ground.

10. The method of claim 8, wherein the cancelling of the noise comprises:
performing combination into a single voice signal by a sound combination unit on the basis of the P voice signal and the N voice signal, to which the same voltage has been applied; and
cancelling noise induced in the voltage, via the combination.

11. The method of claim 10, wherein the cancelling of the noise comprises cancelling noise generated in a plurality of frequency bands and noise directly generated in a voice signal line corresponding to the P voice signal and the N voice signal, via the combination of the P voice signal and the N voice signal.

12. The method of claim 10, wherein the sound combination unit comprises: a power amplifier configured to amplify the P voice signal and the N voice signal; and
a switch configured to determine a microphone operation scheme to be one of a single-ended scheme and a differential scheme.

13. The method of claim 10, further comprising transmitting the combined single voice signal to an analog-to-digital converter (ADC) so as to convert the transmitted voice signal into a digital signal.

14. The method of claim 8, wherein the headset is an external device including a microphone and an earphone, and performs:
receiving a voice signal of the user on the basis of the microphone when the microphone is connected to the electronic device; and
outputting a voice signal of a counterpart on the basis of the earphone.

* * * * *